United States Patent [19]

Weglin

[11] 3,990,142
[45] Nov. 9, 1976

[54] CIRCUIT BOARD, METHOD OF MAKING THE CIRCUIT BOARD AND IMPROVED DIE FOR MAKING SAID BOARD

[75] Inventor: Walter Weglin, Bellevue, Wash.

[73] Assignee: Jerobee Industries, Inc., Kirkland, Wash.

[22] Filed: July 17, 1975

[21] Appl. No.: 596,766

Related U.S. Application Data

[60] Division of Ser. No. 402,816, Oct. 2, 1973, Pat. No. 3,911,716, which is a continuation-in-part of Ser. No. 145,720, May 21, 1971, abandoned.

[52] U.S. Cl. .............................. 29/625; 156/261; 174/68.5
[51] Int. Cl.² ........................................ H05K 3/02
[58] Field of Search ................. 29/624, 625, 203 B, 29/203 D; 72/324, 325, 327, 333; 83/685; 113/119; 156/251, 261; 174/68.5; 225/93, 103

[56] References Cited
UNITED STATES PATENTS

3,678,577  7/1972  Weglin et al. ..................... 29/625
3,713,944  1/1973  Dennis et al. ..................... 156/261

Primary Examiner—James R. Duzan
Attorney, Agent, or Firm—Graybeal, Barnard & Uhlir

[57] ABSTRACT

Stamping a sheet of conductive foil by means of a die of a predetermined pattern against a dielectric substrate to shear out foil sections and pressing them against the substrate while applying heat through said die to the sheared sections so as to bond the sections by means of a thermal curing adhesive to the substrate. The die has a plurality of individual die elements which shear out individual foil sections. Each die element has two lateral high pressure surfaces, a recessed middle portion and two transitional surface portions between the high pressure surfaces and the middle portion. The outer edges of each die element are shearing corners or edges, with the high pressure surfaces applying the shearing forces to the foil and substrate. In one embodiment the high pressure surfaces which produce the shearing forces against the foil sheet are substantially parallel to the foil sheet being engaged, and in another embodiment the high pressure surfaces are sloped at about 45° to the surface of the foil sheet it is engaging. The transitional surfaces of each die element are convexly curved toward the recessed middle to provide a proper force distribution which declines in magnitude toward the middle die portion, and join to the middle portion with a concave curvature.

21 Claims, 23 Drawing Figures

CIRCUIT BOARD, METHOD OF MAKING THE CIRCUIT BOARD AND IMPROVED DIE FOR MAKING SAID BOARD

CROSS REFERENCE TO RELATED APPLICATIONS

This is a divisional application of my pending U.S. patent application, entitled "A Circuit Board, Method of Making The Circuit Board and Improved Die for Making Said Board", Ser. No. 402,816, filed Oct. 2, 1973, now U.S. Pat. No. 3,911,716, which is a continuation-in-part application to my now abandoned U.S. patent appliction, entitled "A Circuit Board, Method of Making the Circuit Board and Improved Die for Making Said Board", Ser. No. 145,720, filed May 21, 1971.

BACKGROUND OF THE INVENTION

1. Field of the Invention

This invention relates to the art of making printed circuit boards by stamping the circuit board elements from a metal foil.

2. Description of the Prior Art

The prior art shows various devices and methods for stamping out from a foil sheet a circuit pattern for a printed circuit board. The two main methods used in the prior art for making circuit boards by die stamping are: (a) by use of a flat face die and (b) by use of a knife edge die.

For example, in U.S. Pat. No. 3,678,577, entitled, "Composite Structure and Method of Making the Same", by Walter Weglin and Charles W. Wildebour, issued July 25, 1972, there is disclosed a method of engaging a foil sheet with a flat-faced die to shear out a circuit pattern. Simultaneously heat is applied to the foil to cause a thermal setting adhesive between the foil and a dielectric base to bond the sheared foil sections to the substrate. As another example of the prior art, U.S. Pat. No. 2,986,804, to Greenman et al. discloses the use of a die element having an extended portion to also form holes in the dielectric for terminals. Further examples of the prior art are shown in Greenman et al, U.S. Pat. No. 2,988,839; Spiwak et al., U.S. Pat. No. 3,301,730; Anderson, et al., U.S. Pat. No. 3,340,606; and British Pat. No. 745,773.

With regard to making circuit boards by die stamping with a flat face die, one of the problems associated with that process is that it is not possible to make circuit boards where the circuit elements are any closer than about one-tenth of an inch from each other (measured center line to center line). When it is attempted to make circuit boards with a flat face die with the circuit elements closer than one-tenth of an inch, the stamping die is simply not able to shear out the circuit elements. Application of greater pressure to attempt to accomplish the shearing merely results in crushing the substrate onto which the circuit elements are to be formed, The use of knife edge dies in stamping out circuit components from a foil sheet is shown, for example, in Petri, U.S. Pat. No. 3,015,718, which illustrates a heated die having two knife edges to cut out the circuit element. By applying pressure and heat from the die, a thermal setting adhesive positioned between the foil material and the substrate causes the foil circuit element to be bonded to the substrate. One of the advantages of having a knife edge die is that the knife edge is better able to cut out the foil sections. However, it is difficult to keep the knife edge sharp, and as the knife edge becomes dull, it will oftentimes stamp out thin ribbons of foil at the edge of the circuit elements, and these sometimes remain on the circuit board and cause it to short out. Another problem associated with knife edge dies is that when circuit elements are being formed on a thin film, such as a plastic sheet several thousandths of an inch thick, the knife edge sometimes penetrates through the thin film so as to damage the same.

Other examples of the prior art which show various forms of a knife edged die are: Courtenay, U.S. Pat. No. 1,646,613; Franklin, U.S. Pat. No. 2,647,852; Franklin, U.S. Pat. No. 2,622,054; and Franklin, U.S. Pat. No. 2,753,619.

Other patents showing various foil stamping methods are: Debacher, U.S. Pat. No. 1,187,510; Choate, U.S. Pat. No. 1,406,538; Greenman et al., U.S. Pat. No. 2,272,003; and Anderson et al., U.S. Pat. No. 3,052,832.

It is an object of the present invention to accomplish the practical manufacture of circuits by a die stamping process, either on a board or a thin film dielectric, where the circuit elements are relatively closely spaced and relatively long die life is achieved in the manufacturing process.

SUMMARY OF THE INVENTION

The preferred application of the present invention is in making printed circuit boards, and the present invention resides in a method of shearing out foil sections from a metal foil sheet in the formation of such boards and a circuit board made by such method and die.

In describing the method of the present invention, a foil element which is sheared out from a foil sheet is considered as having two lateral portions at the edges of the element, a middle portion between the two lateral portions, and two transitional portions, each positioned between a respective lateral portion and the middle portion. The foil sheet is placed against a surface of a yielding substrate. Then the foil sheet at the locations of the lateral portions of the pattern element to be pressed out of the foil is engaged by means of two high pressure surfaces which press the lateral portions of the foil element moderately into the substrate, with the general plane of each of the high pressure surfaces having a substantial angular component parallel to the foil sheet. The shearing of the foil element takes place at the outer edges of the two high pressure surfaces.

At the same time, pressure relief is provided to the foil at the location of the middle portion of the pattern element, while the foil sheet at the location of the transitional portions of the foil element are engaged by, respectively, two transitional pressure surfaces, each of which extends from a related inner portion of its related high pressure surface inwardly, with the slope of a line tangent to the transitional surface with respect to the plane of the foil sheet increasing in an inward direction along the transitional surface, whereby force components of said transitional surface exerted perpendicular to the plane of the foil sheet decrease in magnitude in an inward direction. The effect of this is that while an abrupt shearing force is applied at the outer edges of the high pressure surfaces, the forces exerted by the transitional surfaces decrease at a moderate rate towards the middle of the foil element, so that no shearing of the foil takes place at the transitional surfaces. Further, the decrease of magnitude of the force exerted from the high pressure surface across the transitional surfaces to the middle pressure relief area causes high unit loading at a relatively small area at the high pressure surfaces. Since the pressure from the high pressure surfaces is distributed both outwardly and downwardly into the yielding substrate, and since the initial pressure area of the high pressure surfaces are relatively small, the compressive forces into the yielding substrate are dissipated at a high rate relative to the depth to which these forces are imparted into the substrate. The over all effect of this is to cause substantially less compressive force outwardly of the high pressure surfaces, which better enable the substrate outwardly of the high pressure surfaces to provide an upward counter force to the downward force of the high pressure surfaces and thus provide a more abrupt shearing action to separate the foil element from the foil sheet at the outer edges of the high pressure surfaces.

A particular die configuration of the present invention especially adapted for carrying out the above described method is a die having a plurality of die elements, with each die element having a die face to engage the foil sheet and shear out a related foil element corresponding in shape to the die face. The die face of each die element has two lateral or shoulder portions at the outer edges of the die element, a middle portion, and two transitional portions, each of which lies between a related shoulder portion and the middle portion. Each lateral portion provides a high pressure surface to engage the foil sheet and shear the foil sheet along the outer edges of the shoulder portion. The high pressure surface of the lateral portion lies in a plane having a substantial angular component parallel to the foil sheet it engages. In one embodiment, the high pressure surfaces are substantially parallel to the foil sheet and in another embodiment are angled at approximately 45° to the foil sheet.

The middle portion of the die is recessed so that at most only moderate pressure is exerted by the middle portion of the die against the middle portion of the foil element being sheared from the sheet. Each of the two transitional portions of each die surface extend inwardly as a continuation of its related high pressure surface and is convexly curved, such that the slope of a line tangent to the transitional surface with respect to the foil surface increases in an inward direction along the transitional surface. As the die is pressed against a foil sheet on a yielding substrate, the resultant forces exerted by the transitional surface against the foil are substantially perpendicular to the die surface at the area of contact at which each force vector is exerted, so that the force component of each vector that is perpendicular to the plane of the foil sheet decreases along the transitional surface in an inward direction because of the increased slope of the transitional surface in an inward direction.

In carrying out the method of the present invention by means of the above described die, a foil sheet is placed against a yielding substrate, with a thermal setting adhesive therebetween. This substrate can be a dielectric of adequate thickness (e.g. 1/32 of an inch, depending on the nature of the substrate) to provide sufficient yield for the stamping operation, or it can be a relatively thin substrate (e.g. a thin sheet of polyethylene of perhaps 0.002 inch to 0.005 inch) placed on a backing such as fiberboard. Alternately the substrate could be a coating of material sufficient to produce shear on a base material (e.g. epoxy on a metal core).

This assembly (the foil sheet, adhesive and substrate) is placed on the lower plate of a press. The die is located on an upper plate of the press and then pressed down against the foil sheet. The high pressure surfaces of the shoulder portions of each die element first engage the foil sheet to press the foil portions they engage down into the yielding substrate a short distance, with the outer shearing edges of the shoulder portions of each die element imparting abrupt shear forces to shear out a corresponding foil section. The transitional surfaces of each die element engage the foil in a manner to form the foil against its contour, with the force exerted against the foil sheet decreasing more gradually inwardly toward the middle of the die element without shearing the foil. The middle recessed portion of the die element provides pressure relief at the middle portion of the foil section being sheared from the sheet and at most presses moderatly against the middle portion of such foil section, thus permitting higher pressure loading at the smaller areas of the shoulder portions of each die element, thereby enhancing the shearing action of the die elements as described above.

As in some of the prior art methods, in the preferred embodiment, the die is heated so that it simultaneously bonds the sheared foil sections to the substrate by means of the thermal setting adhesive as it is shearing the sections from the foil. Subsequent to shearing the foil elements against the substrate, a further operation is performed to better bond and/or set the foil elements in the substrate. In general this is accomplished by applying moderate heat and pressure to press the foil elements into the substrate.

DESCRIPTION OF THE PREFERRED EMBODIMENTS

Figure 1:
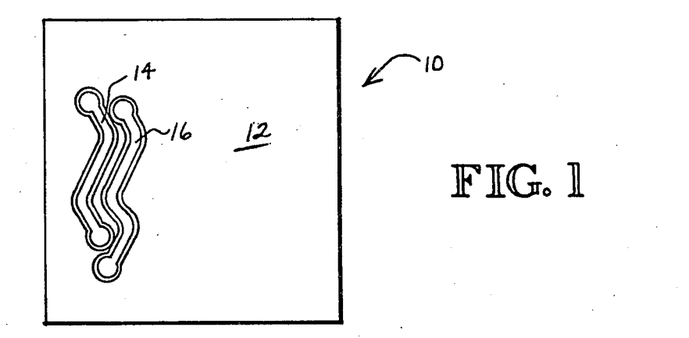
FIG. 1 is a plan view showing two circuit elements of a circuit board adapted to be made according to the present invention.

FIG. 1 illustrates a circuit board 10 made according to the present invention, which board 10 comprises a sheet or board 12 made of a dielectric material and two circuit elements 14 and 16 made of thin foil sections bonded to the dielectric 12. It is to be understood that usually there will be a greater number of such circuit elements 14 and 16. Only two are shown here for convenience of illustration.

Figures 2, 3, 4:
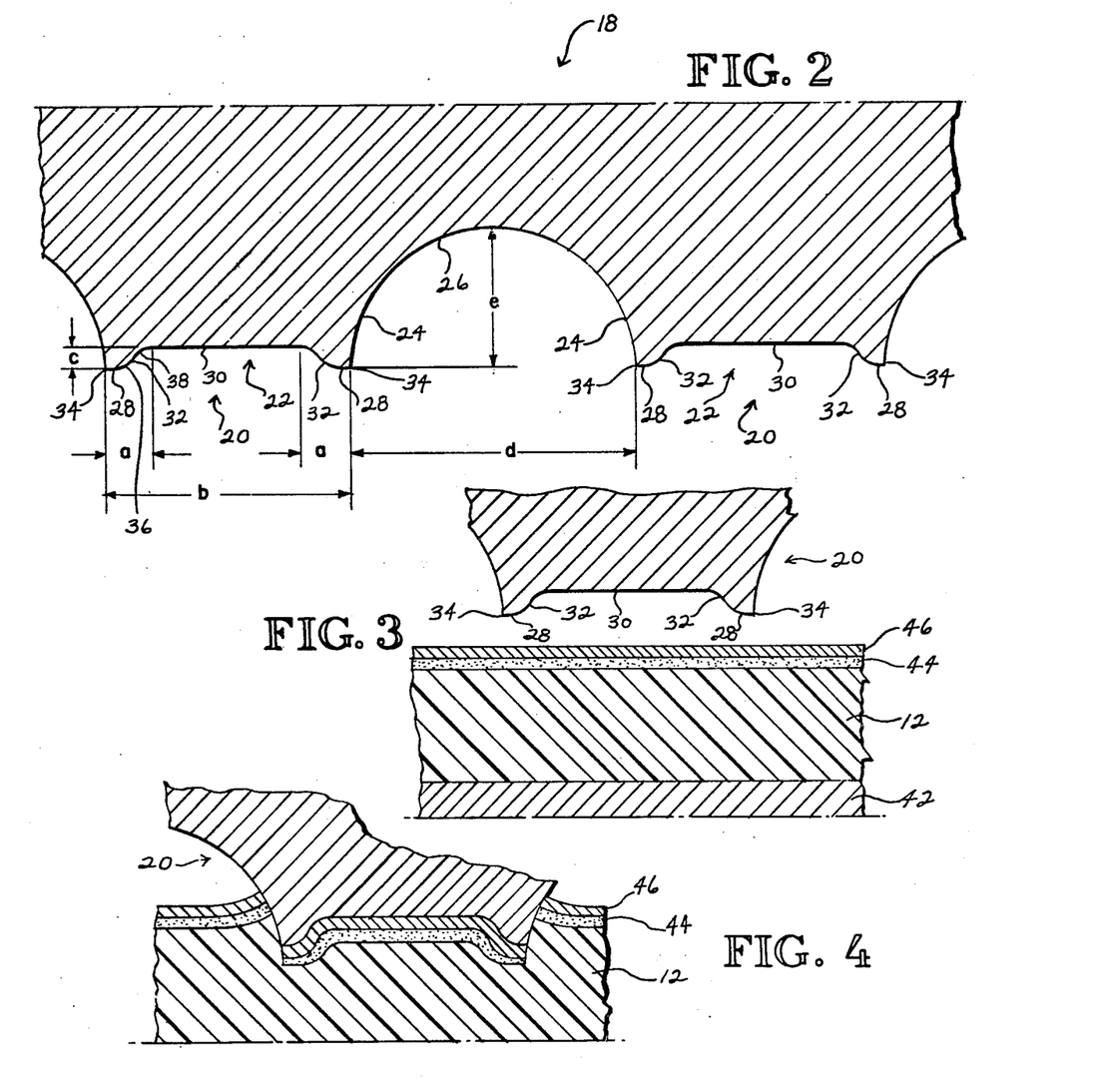
FIG. 2 is a vertical sectional view of a portion of a die, adapted for use in a first embodiment of the method of the present invention.
FIG. 3 is a vertical sectional view showing a die element of the die of FIG. 2 about to shear out a foil section.
FIG. 4 is a view similar to FIG. 3 but showing the die element having sheared out a foil section and bonding the same to the dielectric.

FIG. 2 illustrates a first die configuration, which is used in the first and second embodiments of the method of the present invention described herein. The die is designated 18, with two die elements being shown at 20. Each die element 20 is a male or punching die and has a foil engaging face or die face 22 and two side surfaces 24. Between adjacent die elements there is a recess area or cavity 26 defined by adjacent side surfaces 24 from adjacent die elements 20, which recess 26 functions to receive the excess foil such as that which is sheared away between the circuit foil sections 14 and 16. For purposes of description, the general plane of the die face 22, i.e. the foil-engaging plane, will be considered as a horizontal plane, while planes perpendicular thereto will be considered as vertical.

The die face 22 of each die element 20 comprises two lateral surface portions 28, a middle portion 30, and two transitional surface portions 32, each of which is positioned between a related lateral portion 28 and the middle portion 30. Each lateral surface portion 28 functions in the method of the present invention as a high pressure surface to exert substantial shear forces to the foil sheet which it engages. Each surface 28 is generally planar or moderately convex, and is so positioned as to have a substantial angular component (i.e. a substantial angular component parallel to the foil sheet which it engages). Each high pressure surface 28 meets the side surface 24 at an abrupt corner 34 which, as will be described hereinafter, functions as a shearing corner or edge in the method of the present invention. In the present embodiment, with the high pressure surface 28 being nearly parallel to the plane of the foil it engages, this shearing corner 34 is substantially a right angled shearing corner.

The middle recessed portion 30 fo the die surface 22 is in the present embodiment positioned in a substantially horizontal plane and is recessed moderately with respect to the high pressure surfaces 28. Each transitional surface 32 extends inwardly from the inner portion of its related high pressure surface 28 in an inward convex curve 36 and joins to the middle surface portion 30 at an inner concavely curved area. Thus the overall curvature of the transitional surface 32 is in the nature of an S curve. The slope of each transitional surface portion 32 with respect to the horizontal plane (i.e. the plane of the foil it engages) increases in an inward direction from its related high pressure surface 28, so as to form its convex surface portion 36 and decreases further inwardly near the middle portion 30 to form the concave portion 38.

The first embodiment of the method of the present invention will now be described with reference to FIGS. 3 through 5. In FIG. 3 is shown a portion of a lower plate 42 of a press, on which is placed a dielectric substrate 12. On this substrate 12 is placed a thin sheet 44 of a thermal setting adhesive, and on top of this adhesive sheet 44 is placed a sheet 46 of metal foil (in the present embodiment about 0.001 inch to 0.005 inch thick) out of which electrically conductive foil sections, such as those at 14 and 16, of the circuit 10 are to be formed. The adhesive sheet 44 is desirably a sheet about .001 inch thick, having a quick reaction time, or the adhesive could be a lamination on the foil or the substrate. Examples of suitable adhesives are CMC-195 or CMC-1060 sold by Circuit Materials Corp., Hoosick Falls, New York. The dielectric substrate can be, for example, an FR-3 paper epoxy made by the NVF Company, an FR-2 paper phenolic made by General Electric Company, or a G-10 glass epoxy made by Westinghouse Corp. The foil material can be, for example, one ounce electrolytic grade copper made by Gould, Inc. It is to be understood, of course, that in a single circuit board, there could be as many as 100 or more individual circuit elements, and for each circuit element (such as those at 14 and 16) which are to be formed, there is a corresponding die element 20 whose pattern (i.e. configuration) corresponds to the circuit element being formed.

The die 18, having previously been heated to a desired temperature (e.g. 225° to 275° F.), for example by attaching the die to a heated platen, to cause the thermal setting adhesive sheet to become adhesive in the areas where the die elements 20 contact the foil sheet 46 immediately thereabove, if then moved downwardly to engage the foil sheet 46 and press it moderately into the substrate 12. The manner in which this is believed to occur is illustrated in FIG. 4.

The particular manner in which the shearing forces are exerted against the foil 46 and into the substrate 12 in this first embodiment can best be explained with reference to FIGS. 15 through 19. While the following explanation of the application of forces into the foil sheet and substrate are reasonably justified on the basis of substantial experimental work, it is to be understood that in consideration of the quite close dimensions involved (e.g. in the order of thousandths of an inch), and the high unit pressures exerted (e.g. sometimes substantially in excess of one hundred thousand psi), it is difficult to ascertain with any great precision the effect of all the phenomena involved. However, it is to be understood that regardless of the precision or lack of precision in the following explanation, the present invention has been found to be a practical solution to the problem of making circuit boards by a die stamping process, with the circuit elements being closer together than was heretofore possible while maintaining substantially longer die life.

Figure 15:
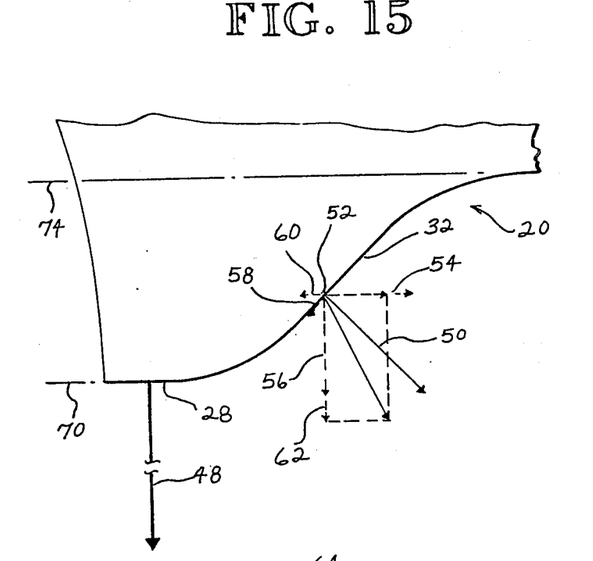
FIG. 15 is a schematic drawing of a portion of a die element illustrating the application of forces exerted by the same.

Reference is now made to FIG. 15, which illustrates one side of a die element 20. As a preliminary consideration, it is to be understood that as greater pressure is exerted by a die surface on a substrate, the further the die surface penetrates into the substrate, and consequently the greater is the opposite resisting force of the substrate with the deeper penetration of the die surface. Thus since the high pressure surface 28 penetrates furthest into the substrate, there is indicated a maximum force vector 48 which is exerted perpendicular to the surface 28 into the substrate. At an intermediate location on the transitional surface 32, there is a force vector exerted normal to that surface position, which as shown herein is approximately 45° to the horizontal, this force vector being designated 50. The magnitude of this force vector 50 is somewhat less than the force vector 48, since the penetration at the point 52 from which the vector 50 is exerted into the substrate is less than the penetration of the high pressure surface 28. The force vector 50 can be broken into horizontal and vertical force components 54 and 56, respectively.

In addition to the force exerted normal to the surface 32 at the point 28, there is a frictional force to be considered. As the die element 20 is pressed against the metal foil, there is some tendency for the foil 46 to slip along the transitional surface 32. Thus there is a frictional force vector 58 exerted parallel to the surface 32, and thus at the point 52 the force vector 58 is at right angles to the force vector 50. The magnitude of the force vector 58 is equal to the coefficient of friction between the foil 46 and the die surface 22 multiplied by the force vector 50. On the assumption that the metal contact of the foil 46 against the die surface 22 has a coefficient of friction of two-tenths (i.e. 0.2), the magnitude of the force vector 58 would be one-fifth of the force vector 50. In resolving these force vectors, the horizontal component 60 of the force vector 58 is subtracted from the horizontal component 54, while the vertical component 62 of the force vector 58 is added to the component 56. In summing up these components, it will be observed that as the slope of the transitional surface 32 increases, because of the substantially greater magnitude of the vector 50 in comparison with the vector 58, the resultant vertical force component, obtained by adding the component 56 and 62 decreases until the concavely curved area 38 is reached. Further, in proceeding inwardly along the transitional surface 32 toward the middle portion 30, the penetration into the substrate is less, the over all magnitude of the vectors 50 and 58 decrease, which further decreases the resultant vertical force against the substrate.

Figure 16:
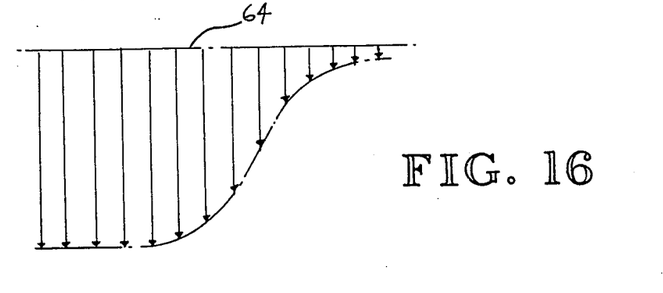
FIG. 16 is a graph illustrating a typical vertical force distribution pattern of the die portion illustrated in FIG. 15.

This is illustrated in the graph of FIG. 16 which is illustrated directly below FIG. 15, with the points along the base line 64 of the graph being vertically aligned with corresponding points on the die surface 20. Obviously, the relative magnitude of the force components will vary, depending on a number of factors, and the particular pattern illustrated in FIG. 15 is merely an approximation, illustrating the general pattern.

Figure 17:
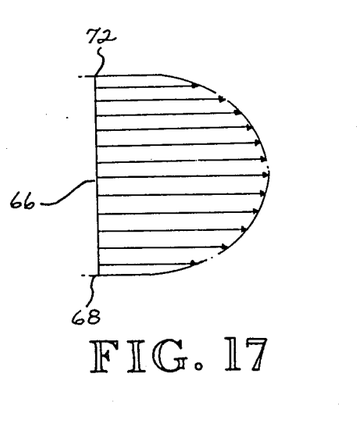
FIG. 17 is a graph similar to FIG. 16 but illustrating the lateral force distribution of the die portion illustrated in FIG. 15.

Also, the transitional surface of the die surface 22 exerts horizontal force components into the foil and substrate. The magnitude of such horizontal force components depends mainly upon the degree of penetration into the substrate at the particular location at which the force is exerted and the slant of the plane of the die surface 20 at the point of force application. The graph of FIG. 17 provides an approximation of the distribution of magnitude of such lateral forces. The base line 66 of the graph of FIG. 16 has a lower point 68 coinciding with a plane (indicated at 70 in FIG. 14) coinciding with the high pressure surface 28, and the upper point 72 of the base line 66 coinciding with a plane (indicated at 74 in FIG. 14) coinciding with the middle die surface portion 30.

Figures 18, 19:
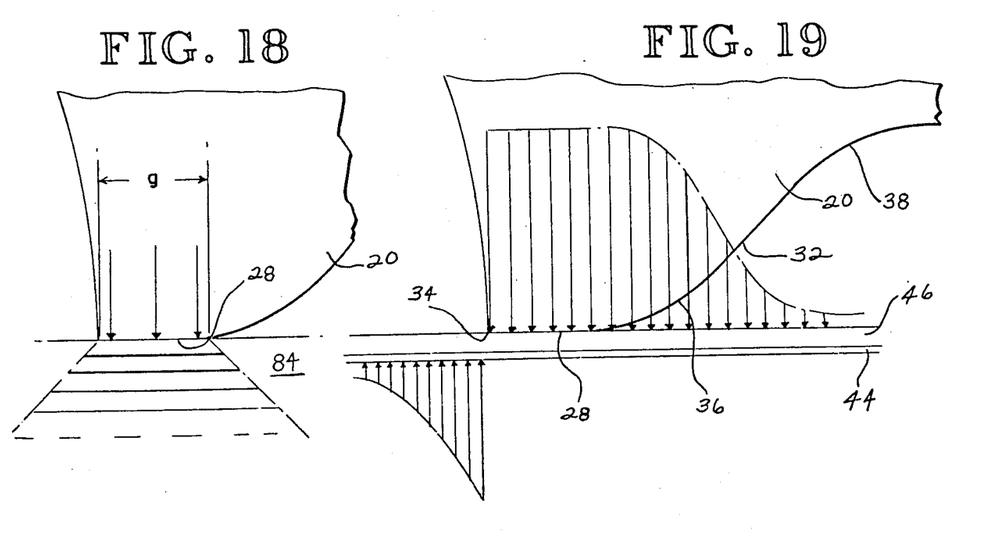
FIG. 18 is a diagrammatic view illustrating the manner in which compressive forces are transmitted into the substrate.
FIG. 19 is a digrammatic view illustrating the force distribution on a foil element being sheared.

Another aspect of the method of the present invention is illustrated in FIG. 18. As a general consideration, when a compressive load is applied to a substrate, the compressive force is imparted to the substrate in an outwardly extending pattern at approximately 45° to the direction of the application of the force. Also, the unit pressure which is exerted at any particular level in the substrate is equal to the magnitude of the force divided by the area over which it is distributed. Thus, with reference to FIG. 18, it can be seen that the force of the die surface 28 is exerted against the substrate at a relatively small area (e.g. an area of perhaps 0.002 inch wide, indicated at g in FIG. 18). Thus at a level below the substrate surface a distance of approximately 0.001 inch, where the area of the force application would be approximately twice that of the contact area of the surface 28, the unit pressure diminishes to about one-half that existing at the contact surface of the substrate. As the force is distributed down through successive levels, the unit pressure is further diminished because of the broadening of the area of force application. Further, there are internal frictional forces of the substrate itself which can be presumed to further diminish the application of force down to the substrate.

Since these compressive forces that are distributed downwardly and outwardly from the high pressure surface 28 tend to distort the substrate in some proportion to the magnitude of the forces, it can be seen that the degree of distortion in the substrate diminishes at a relatively high rate downwardly. A further consideration is that the compressive force below the high pressure surface 28 causes corresponding shear stresses in the substrate area 84 laterally of the area of the compressive force. However, since the highest application of pressure from the surface 28 is in the immediate area of the surface 28, the shear forces which would tend to compress the substrate area 84 are diminished at a relatively high rate in a direction outwardly of the high pressure surface 28.

Consideration is now given to the application of shear forces at the outer corner or edge 34 of the face 28 of the die element 20, with reference to FIG. 19. The maximum downward compressive force is exerted at the lateral high pressure surface 28. This compressive force from the surface 28 drops abruptly to substantially zero at the outer corner 34. To the left of the corner 34 (as seen in FIG. 19), the substrate 12 exerts a substantial upward resistive force against the foil sheet 46. This force diminishes at a less abrupt rate in a direction further from the shearing corner 34. The net result is to impart abrupt shearing forces of sufficient magnitude at the corner 34 to shear out a foil section along a line corresponding to the corner 34. The forces exerted by the transitional surfaces 32 provide a force pattern between the surfaces 28 and 30 of a more gradual rate of change, to alleviate any tendency toward abrupt force changes which could cause an undesired shear force inwardly of the shear line 34.

It is believed that simultaneously with the shearing action, the transitional surface 32 causes some inward extrusion of the substrate material 12 toward the middle recessed portion 30 of the die face 22. It is believed that this alleviates to some degree a tendency for the material 12 to extrude outwardly from the die element 20. It is believed that this further enhances the shearing action at the edge line 34 of the die element 20.

It has been found that by shearing out metal foil circuit elements (such as those at 14 and 16) in the manner described in this first embodiment, it is possible to place the circuit elements quite close together (e.g. as close as about 0.020 inch between proximate edges of adjacent circuit elements, and as close as 0.040 inch between center lines of adjacent circuit elements), and also to form quite narrow circuit elements (e.g. width of 0.015 inch). It has been found that circuit boards can be made effectively and reliably in the manner described above, with a die having its die elements 20 dimensioned (as shown in FIG. 2) as follows: the width of the high pressure surface and transitional surface ($a$ dimension) between about 0.002 inch and 0.005 inch; the total width of the die 20 ($b$ dimension) being as small as about 0.015 inch to 0.020 inch; the depth of the recessed middle die face portion 30 ($c$ dimension) being about 0.003 inch to 0.007 inch; the spacing between adjacent die edges ($d$ dimension) being about 0.020 inch; and the depth of the excess foil recess between adjacent die elements 20 ($e$ dimension) being between about 0.10 inch to 0.020 inch.

Figure 5:
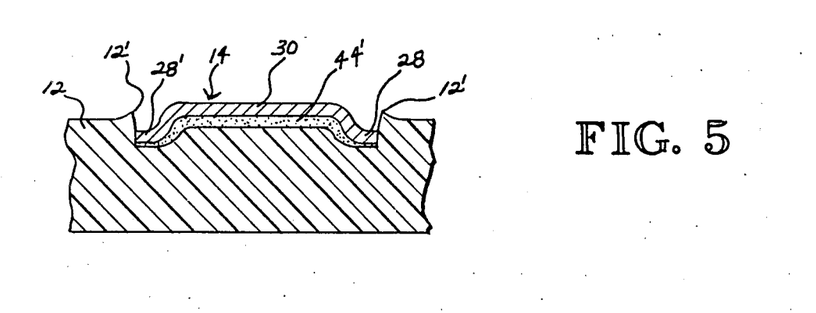
FIG. 5 is a fragmentary sectional view of a circuit board having a circuit element formed by the method shown in FIGS. 3 and 4.

FIG. 5 shows one circuit element 14 of the circuit board 10 made according to the present invention. The edge portions 28' of the circuit element 14 are depressed into the circuit board 12 below its top surface but generally parallel thereto. The middle portion 30' of the circuit board is generally coplanar with the top surface of the substrate 12. The adhesive layer portion 44' beneath the element 14 is cured and bonds the element 14 to the dielectric substrate 12.

Subsequent to the above described shearing and bonding action, it is generally desirable to place the circuit board through a curing process by subjecting both sides of the board to moderate heat and pressure. Such a process suitable for use in the present invention is described in my U.S. Pat. No. 3,678,577. This tends to form the edges 12' of the board 12 adjacent the element 14 in a smooth contour with the element 14.

Figure 6:
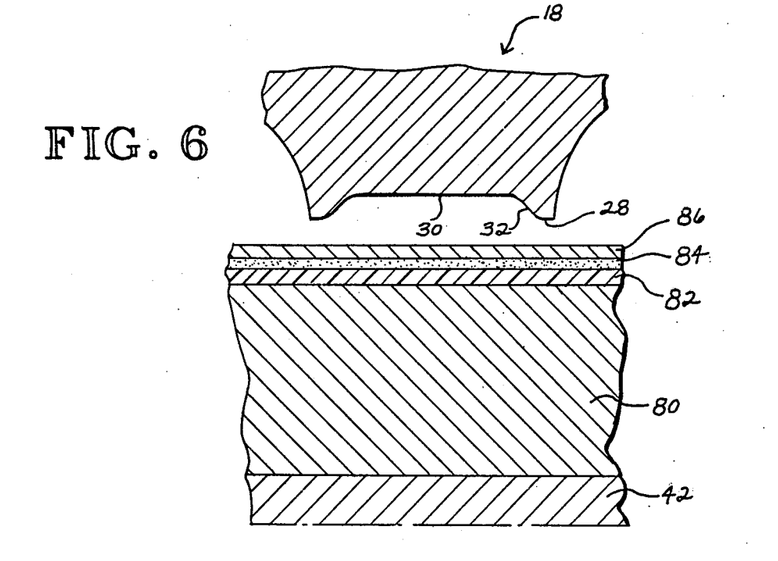
FIG. 6 is a view similar to FIG. 3, illustrating a second embodiment of the method of the present invention with the foil element being bonded to a thin flexible dielectric.
Figure 7:
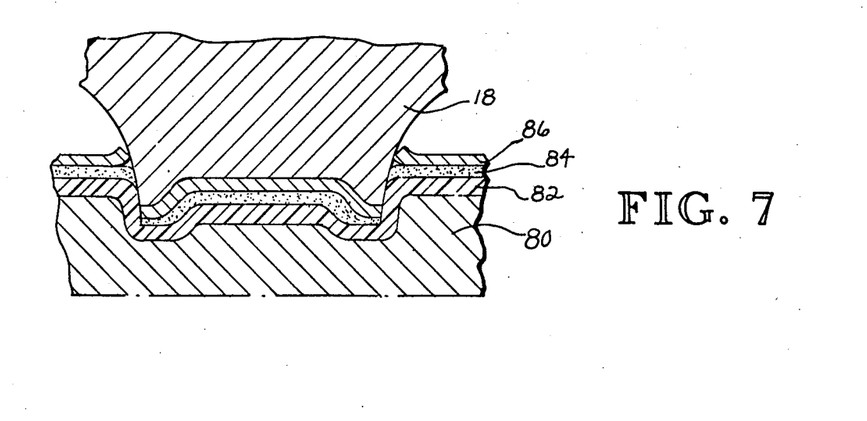
FIG. 7 is a view similar to FIG. 6, further illustrating the method of FIG. 6 and showing the die element engaging the foil to shear out a foil section and bond the same to the thin flexible dielectric.

For some applications it is desirable to form an electrical circuit pattern on a thin flexible dielectric, such as a sheet of polyethylene in the order of 0.002 inch to 0.005 inch thick. The method of accomplishing this according to the present invention is shown in FIGS. 6 and 7. This second embodiment of the method of the present invention is substantially the same as that shown in FIGS. 3 and 4, except that a flexible backing is placed between the lower press plate and the dielectric sheet.

Thus, in FIGS. 6 and 7 is shown a die 18 which is the same as the die shown in FIGS. 2, 3 and 4. There is a yielding backing material 80, such as a press board piece at least about 1/32 inch thick. On top of this backing plate or board 80 is laid a thin dielectric sheet 82, such as polyethylene or Mylar. On top of the dielectric sheet is placed a thermal setting adhesive sheet 84 and a foil sheet 86 on top of that. The adhesive sheet should be one that is flexible after setting, such as a rubber base thermo plastic adhesive, for example, CMC-666, made by Circuit Materials Corp.

The heated die 18 is pressed against the foil sheet 86 as shown in FIG. 6. The results are substantially the same as shown in FIG. 4, except that the dielectric sheet, being a relatively tough and durable material, forms around the outer edge 34 of the die 20 without shearing, and the foil sections are sheared out of the foil sheet 60 as described above and bonded to the dielectric sheet 56. The dielectric sheet returns to a substantially flat surface after being stretched during the shearing operation.

Figure 8:
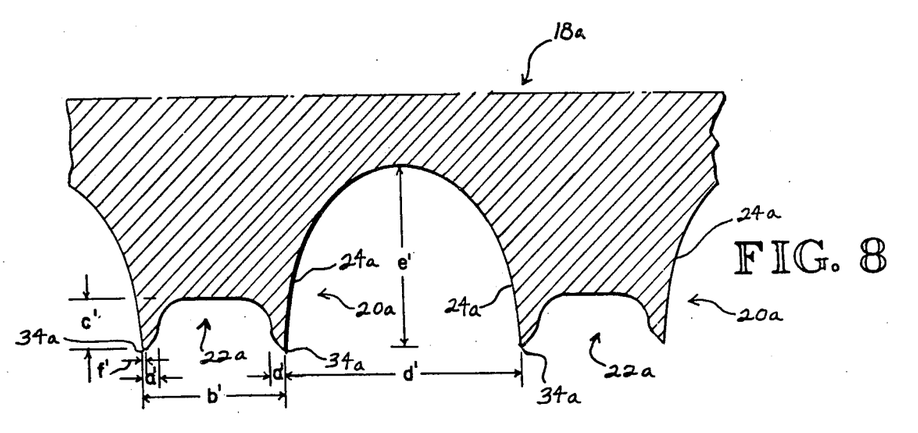
FIG. 8 is a view similar to FIG. 2 illustrating a modified form of the die employed in the method of the present invention.

FIG. 8 illustrates another die configuration, used in the third embodiment of the method of the present invention. Elements of the die of FIG. 8 corresponding to elements of the die of FIG. 2 will be given like numerical designations, with an $a$ suffix distinguishing those of the die of FIG. 8.

Thus the die 18a has two die elements 20a, each of which has a die face 22a and side surfaces 24a. Each die face 22a has two high pressure surfaces 28a, a middle surface portion 30a, and two transitional surfaces 32a, each with a convexly curved portion 36a and a concavely curved portion 38a.

The configuration of the die of FIG. 8 differs essentially from that of FIG. 2 in that the two high pressure surfaces are sloped from the horizontal (i.e. the plane of the foil being engaged). In the present configuration, this slope is shown to be at about 45° to the horizontal, so that each of the two shearing corners 34a are formed by two surfaces meeting at about a 45° angle. However, slopes greater and lesser than 45° have been utilized in such die configurations. Also, it is possible, and in some instances desirable, to form the corner 34a with a thin upstanding edge of quite small dimension (e.g. a thousandth of an inch or less).

The particular advantage of the die configuration of FIG. 8 is that it is possible to make a circuit board with the elements somewhat smaller and closer together (measured from center line to center line of the die elements) than with the die configuration of FIG. 2. Thus the die elements 20a of FIG. 8 can be made with the width of one high pressure surface 28a and transitional surface 32a (dimension $a$ in FIG. 8) being as small as 0.002 inch, the over all width of a die element 20a (dimension $b$ in FIG. 8) being as small as 0.012 inch, the depth of the middle recessed portion 30a (dimension $c$ in FIG. 8) being about 0.005 inch, the spacing between proximate corners 34a of two die elements 20a (dimension $d$ in FIG. 8) being about 0.020 inch, and the depth of the recess 26a between die elements 20a (dimension $e$ in FIG. 8) being about 0.020 inch. Also the width of an upstanding edge at 34a would be somewhat less than 0.001 inch. The side walls 24a of each die element 20a desirably have a slight diverging slope from the shear corners 34a to enhance removal of the excess foil from the recesses 26a.

Figure 9:
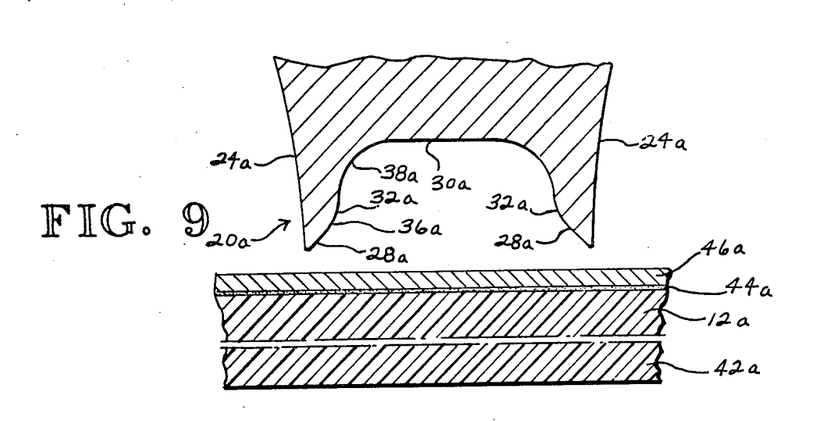
FIG. 9 is a view similar to FIG. 3 illustrating a third embodiment of the process of the present invention using the die of FIG. 8.
Figures 10, 11:
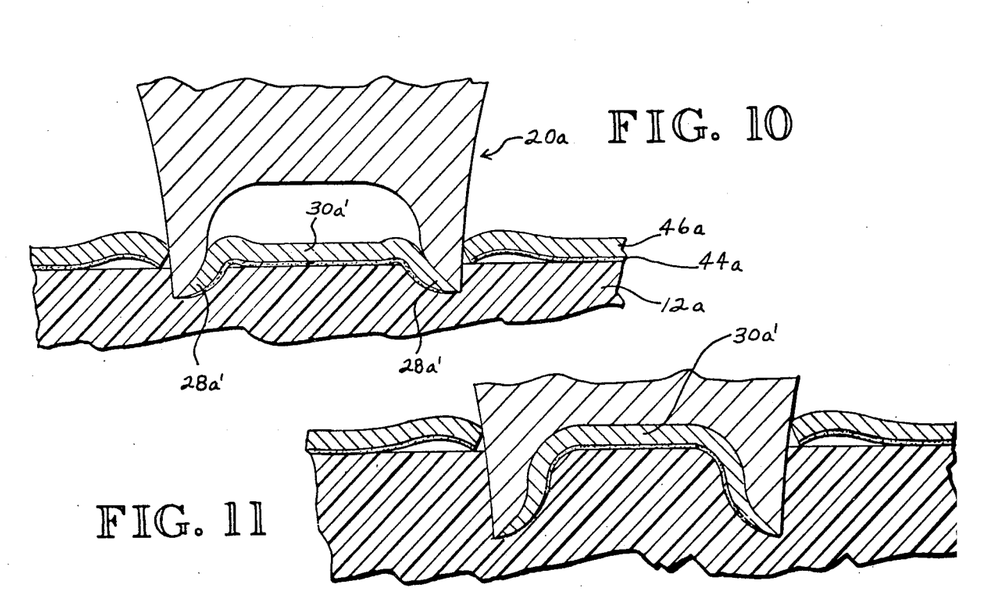
FIG. 10 and FIG. 11 are similar to FIG. 9, further illustrating the third embodiment of the method of the present invention.

FIGS. 9 through 11 illustrate the method of the third embodiment of the present invention. As in the first embodiment, a yielding substrate 12a is placed on a plate 42a, with a layer of adhesive 44a and an overlying foil sheet 46a being placed on the substrate 12a. The heated die element 20a is then brought into engagement with the foil 46a with the die element 20a each shearing out respective foil sections, as illustrated in FIGS. 10 and 11.

As illustrated in FIG. 10, initially the lateral high pressure surface portions 28a engage corresponding lateral sections 28a' of the foil element 14a being sheared from the foil sheet 46a. At the furthest downward limit of travel of the die 18a, the middle recessed surface 30a engages a middle foil section 20a' to press it with moderate pressure against the adhesive layer 44a and a substrate 12a directly below. The slope of the high pressure surfaces 28a and the transitional surfaces 32a tend to extrude or push the foil section and substrate material inwardly to be contoured around the surfaces 28a and 32a as shown in FIG. 11.

Figures 20, 22:
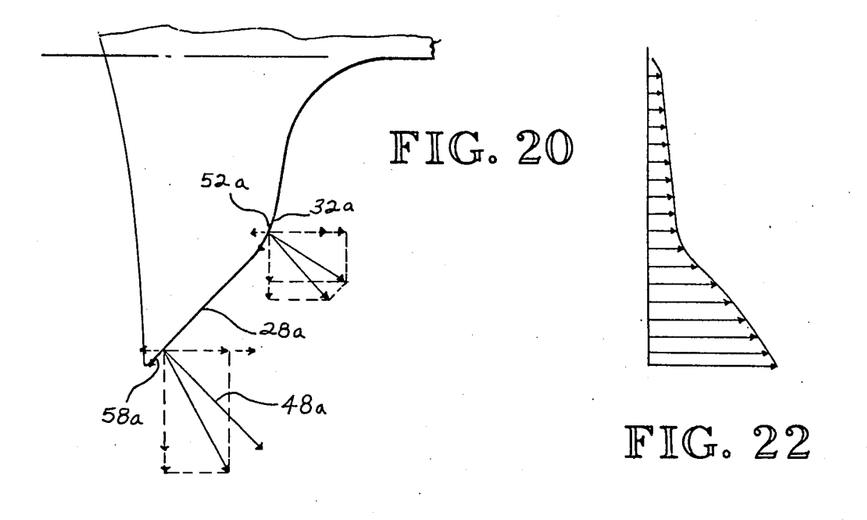
FIG. 20 is a view similar to FIG. 15, illustrating the manner in which the die shown in FIG. 8 exerts forces against the foil being sheared.
FIG. 21 and FIG. 22 are similar to, respectively, FIGS. 16 and 17, but illustrate the vertical and lateral force distribution, respectively, of the die configuration shown in FIG. 8.

The method of the third embodiment is now described in further detail with reference to FIGS. 20 through 23. With reference to FIG. 20, it can be seen that the high pressure surface 28a exerts a force vector 48a perpendicular to the surface 28a, which in the present configuration is 45° to the horizontal. There is also a frictional force vector 58a parallel to the surface 28a. By resolving these two force vectors 58a and 48a, it can be seen that there is a resultant vertical force component and a lateral force component, with the vertical force component being somewhat greater than the lateral force component due to the force contribution of the frictional vector 58a.

Also, a second set of force vectors is indicated at point 52a on the transitional surface 32a. Since the resolution of force components at point 52a is substantially the same as at point 52 in FIG. 15, further description of these force vectors and the resolution of the same is given herein.

Figure 21:
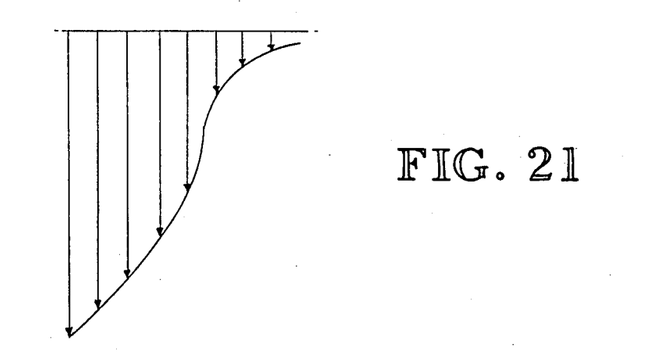

FIGS. 21 and 22 correspond to, respectively, FIGS. 16 and 17, and illustrate, respectively, the vertical and lateral force components exerted along the high pressure surface 28a and transitional surface 32a. It can be seen that in addition to the substantial vertical force components exerted by the high pressure surface 28a, there is also a significant laterally inward set of force components which cause the inward extrusion of the foil 46a and substrate 12a. It is believed that this enhances the separating action of the foil 46a at the shear line existing at the shear corner 34a.

Figure 23:
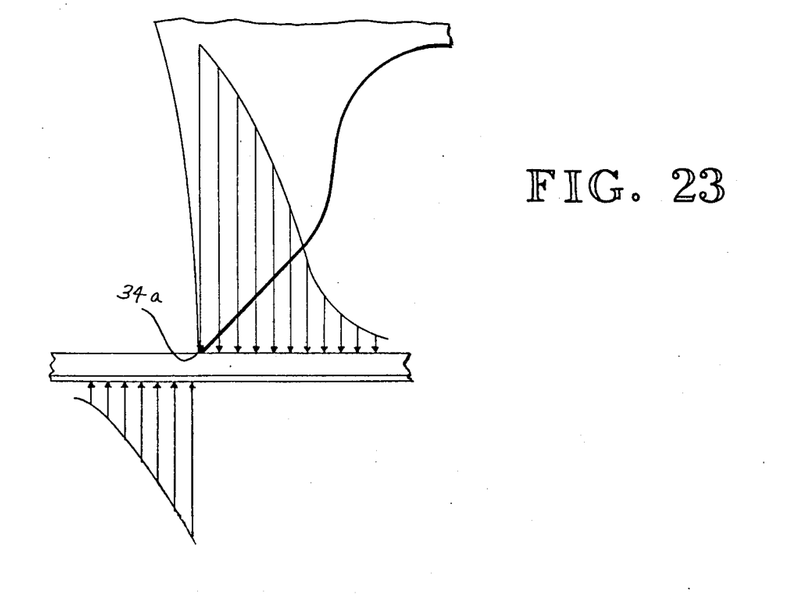
FIG. 23 is a view similar to FIG. 19 illustrating the force pattern exerted upon the foil element by the die shown in FIG. 8.

The distribution of shearing forces on the foil 46a is illustrated in FIG. 23. It can be seen that at the location of the shearing corner 34a, there is an abrupt change in shear forces which causes separation of the foil 46a. Laterally of this area of separation, the forces decline at a sufficiently moderate rate so that additional separation of the foil along these areas of force application does not occur.

Figure 12:
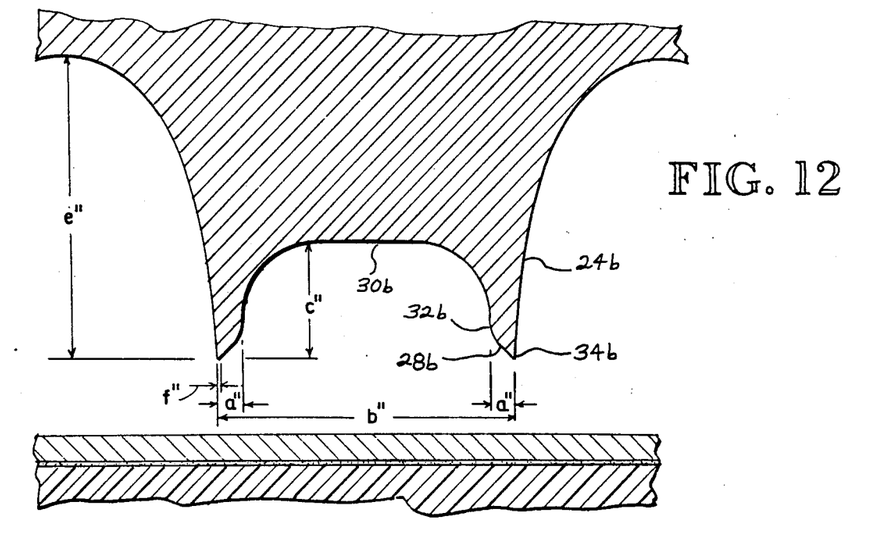
FIG. 12 is a view similar to FIG. 9 showing a die configuration modified to that on FIG. 9, and illustrating a fourth embodiment of the process of the present invention.
Figure 13:
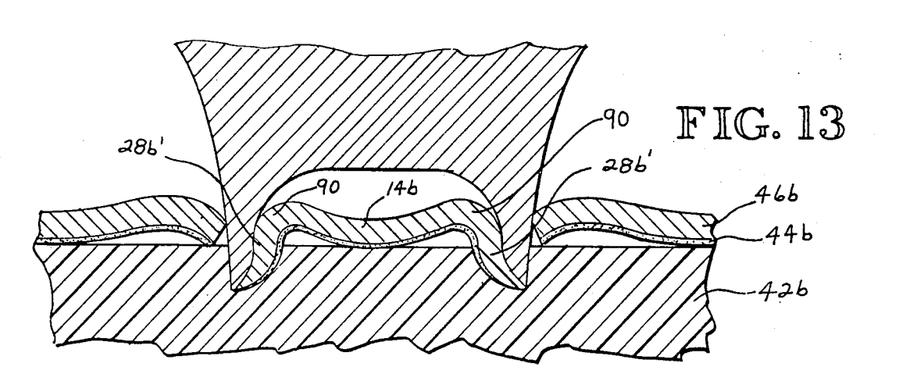
FIG. 13 is a view similar to FIG. 11 further illustrating the method of FIG. 12.
Figure 14:
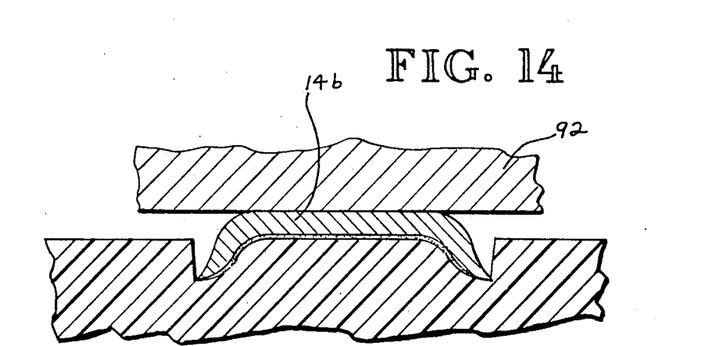
FIG. 14 is a view similar to FIG. 13 illustrating a further step in the method of FIGS. 12 and 13.

The fourth embodiment of the method of the present invention is illustrated in FIGS. 12 through 14. This embodiment is adapted to cut out foil sections from a substantially thicker foil sheet than in the previous three embodiments (e.g. as thick as 0.0135 inch). The configuration of the die elements used in the method of the fourth embodiment are substantially the same as shown in FIGS. 8 through 11, so these will not be described in detail herein. Rather, the componenrs of the die shown in FIGS. 12 through 14 will be given numerical designations similar to corresponding components shown in the die of FIGS. 8 through 11, with a *b* suffix distinguishing those of the fourth embodiment.

The dimensions of each of the die elements 20b are approximately as follows: the width of each high pressure surface 28b and its associated transitional surface (dimension *a* in FIG. 12) is approximately 0.005 inch, the over all width of the die element 20b (dimension *b* in FIG. 12) is about 0.05 inch, the depth of the recessed middle portion 30b (dimension *c* in FIG. 12) is about 0.03 inch, the spacing between the proximate shearing corners 34b and two adjacent die elements 20b (dimension *d* in FIG. 12) is about 0.05 inch, and the depth of the recess between proximate die elements 20b (dimension *e* in FIG. 12) is about 0.05 inch.

In the method of the fourth embodiment, substantially the same procedure is followed as in the third embodiment with generally the same application of forces, so these will not be described in detail herein with reference to the fourth embodiment. However, it should be noted, as illustrated in FIG. 13, that the portion of the foil section being sheared out inwardly of the two lateral foil sections 28b' has a tendency to extrude upwardly as at 90 away from the surface of the substrate 12b. Accordingly, after the shearing out of the die elements 14b, a metal plate 92 is placed against the circuit elements 14b as shown in FIG. 14. This metal plate 92, being heated, causes proper bonding of the foil elements 14b through the adhesive layer 44b to the substrate 12b. Thereafter, a subsequent curing process may be employed, as described in my U.S. Pat. No. 3,678,577.

EXAMPLE I

A paper base epoxy substrate about 0.032 inch thick, 8 inches long and 6 inches wide, EP-22 brand, made by NVF Company, was placed on the lower plate of a press. A sheet of a thermal curing adhesive about 0.001 inch thick, CMC 195 brand, made by Circuit Manufacturing Corp. was placed on top of the substrate. On top of the adhesive sheet was placed a sheet of copper foil, 0.00135 inch thick, electrolytic grade, made by Gould, Inc. of McConnelsville, Ohio.

A metal die made of low carbon steel, was attached to the top plate of the press. This die had approximately 30 die elements formed thereon. Each die element had two shoulder portions and a moderately recessed middle portion. The average width of the foil-engaging face of each shoulder portion was about 0.005 inch. The total width of the narrower die elements was about 0.020 inch. The closest spacing between proximate edges of adjacent die elements was about 0.020 inch. The depth of the relief areas between cavities was about 0.020 inch. The middle recessed portion of the die element was about 0.004 inch in depth.

The die was heated to about 225° F. by means of an electrically heated platen. The upper plate of the press with the die thereon was moved down to engage the circuit board assembly (the substrate, adhesive sheet and foil) with a pressure sufficient to produce shear. The length of engagement was about 50 milliseconds, after which the upper press plate was retracted. A circuit board having a pattern thereon corresponding to the die elements of the die was formed, with the circuit elements bonded securely to, and pressed moderately into, the substrate, and the excess foil between circuit elements remaining substantially free from bond to facilitate stripping.

EXAMPLE II

The same process was followed as described in Example I, except that a paper phenolic dielectric substrate was used instead of the paper epoxy substrate used in Example I. This substrate was XP brand, made by Synthane Taylor Company, 0.062 inch thick. A satisfactory circuit board was attained with all circuit elements bonded securely to the board.

EXAMPLE III

The same process was followed in Example I, except that a 1/32 inch pressboard pad was first placed on the lower plate of the press. An adhesive coated dielectric film, Kapton (DuPont) 200, type F, was placed on top of the pad with the adhesive side up, and a sheet of foil, 1-ounce foil by Gould, Inc., was placed on top of the dielectric. The die was pressed against this assembly to stamp out the circuit elements and bond them to the dielectric.

EXAMPLE IV

Substantially the same process was followed as in Example I, except that the die used was as shown in FIG. 8, with approximately the same dimensions as described previously herein. The closest spacing of circuit elements was about 0.032 inch, measured center line to center line of the circuit elements.

EXAMPLE V

The same process was followed as in Example I, except that the die used had circuit elements substantially as shown in FIG. 12, with approximately the same dimensions for the diie as described previously herein. Also the foil sheet was about 0.0135 inch thick. The closest spacing of the circuit elements, measured center line to center line was about one tenth of an inch.

What is claimed is:

1. A method of shearing from a foil sheet a foil pattern and at the same time bonding the foil pattern to a substrate, which pattern has at least one foil element of a predetermined configuration, said foil element having two lateral portions at the edges of said foil element, a middle portion between the two lateral portions, and two transitional portions, each positioned between a respective lateral portion and the middle portion, said method comprising:
   a. placing a foil sheet against a surface of a yielding substrate with a thermal adhesive layer between the foil sheet and the substrate,
   b. engaging, by means of two high pressure heating surfaces having abrupt outer corner portions, said foil at the locations of the lateral portions of the pattern element so as to press said lateral portions of the foil into the substrate and heat said lateral portions of the foil to cause bonding to the substrate, the general plane of each of said high pressure heating surfaces having a substantial angular component parallel to the foil sheet, thereby creating abrupt shear forces along said corners so as to shear out said foil element,
   c. providing pressure relief to the foil at the location of the middle portion of the pattern element,
   d. engaging the foil sheet at the location of the transitional portions of the foil element with two transitional pressure heating surfaces, each extending from a related inner portion of its related high pressure surface inwardly, with the slope of a line tangent to the transitional surface with respect to the plane of the foil surface increasing in an inward direction along the transitional surface, whereby force components of said transitional surfaces exerted perpendicular to the plane of the foil sheet decrease in magnitude in an inward direction toward said middle portion, and
   e. providing on opposite sides of the foil element cavity areas into which exces foil can become positioned without being bonded to the substrate,
   whereby said foil element is by such simultaneous application of heat and pressure sheared from said foil sheet and bonded to the substrate.

2. The method as recited in claim 1, wherein a moderate pressure heating surface is applied against the middle portion of the foil element with a pressure less than that applied at said high pressure surfaces, whereby bonding of said middle foil portion to the substrate is achieved, while providing pressure relief at said foil middle portion.

3. The method as recited in claim 1, wherein a second foil element is sheared out from said foil sheet and bonded to the substrate in the manner described in claim 1 at a location spaced moderately from the location at which the first foil element is sheared from said foil sheet and bonded to the substrate.

4. The method as recited in claim 3, wherein said foil sheet is a heavy gauge sheet, and second second foil element is sheared from said foil sheet at a distance of about one-tenth of an inch from said first foil element, measured center line to center line.

5. The method as recited in claim 3, wherein said foil sheet is a light gauge foil sheet and said second foil element is sheared from said foil sheet at a location no greater than about 0.04 inch from said first foil element, measured center line to center line.

6. The method as recited in claim 1, wherein said substrate comprises a dielectric sheet placed over a yielding substrate with a thermal setting adhesive located between the foil sheet and the dielectric sheet, and heat is applied to said foil element being sheared out to bond said foil element to said dielectric sheet.

7. The method as recited in claim 1, wherein said high pressure surfaces are each slanted from its respective corner toward said pressure relief location at a substantial angle to the plane of the foil sheet being engaged, whereby the shear forces exerted by said high pressure surfaces against said foil sheet diminish in a direction inwardly toward said middle portion along the high pressure surfaces.

8. The method as recited in claim 1, wherein said high pressure surfaces lie in a plane substantially parallel with the plane of the foil sheet being engaged, whereby the shear forces exerted by said high pressure surfaces are generally uniform across the high pressure surfaces.

9. A method of shearing from a foil sheet a foil pattern and at the same time bonding the foil pattern to a substrate, which pattern has at least one pattern element of a predetermined configuration, said method comprising:
   a. placing the foil sheet against a yielding substrate, with a thermal adhesive layer between the foil sheet and the substrate,
   b. then pressing against said foil sheet a face of a heated die element having a configuration corresponding to said pattern element and having outside cavities on each side of the die element of a depth sufficient to receive excess foil without any significant pressing of such foil into bonding engagement with the substrate, said die face comprising a middle recessed portion and two lateral die face shoulder portions corresponding in shape and location to outer portions of te pattern element, each shoulder portion having an outer abrupt shearing corner, a high pressure surface proximate to said corner and having a substantial angular component parallel to the general plane of said die face, and an inner convexly curved transitional surface joining to said middle portion, c. simultaneously shearing said foil at said shearing corners by means of the high pressure surfaces of the die face shoulder portion, d. engaging said foil along the transitional surfaces of the die shoulder portion to form the foil adjacent thereto against the substrate without separating the foil, and e. simultaneously providing pressure relief at a foil pattern middle portion at the middle portion of the die element, while bonding the foil element to the substrate by a simultaneous application of heat and pressure.

10. The method as recited in claim 9, wherein a heated middle die face portion is pressed against the middle portion of the foil element with a pressure less than that applied by said die face shoulder portions, whereby bonding of said middle foil portions to the substrate is achieved, while providing pressure relief at said foil middle portion.

11. The method as recited in claim 9, wherein a second heated die face is pressed against said foil sheet in the manner described in claim 11 at a location spaced moderately from the location at which the first die face is pressed against said foil sheet.

12. The method as recited in claim 11, wherein said foil sheet is a heavy gauge foil sheet, and said second die face is pressed against said foil section at a distance of about one-tenth of an inch from said first die face, measured center line to center line.

13. The method as recited in claim 11, wherein said foil sheet is a light gauge foil sheet, and said second die face is pressed against said foil section at a location no greater than about 0.04 of an inch from said first die face, measured center line to center line.

14. The method as recited in claim 9, wherein said substrate comprises a dielectric sheet placed over a yielding substrate with a thermal setting adhesive located between the foil sheet and the dielectric sheet, and heat is applied to said foil element being sheared out by said die face as said die face is pressed against said foil sheet to bond said foil element to said dielectric sheet.

15. The method as recited in claim 9, wherein the high pressure surfaces of the shoulder portions have a substantial angle with respect to the general plane of the die face, whereby shearing forces exerted by said high pressure surfaces decline in a direction inward toward said middle portion.

16. The method as recited in claim 9, wherein the high pressure surfaces of the shoulder portions are substantially parallel to the general plane of the die face, whereby the shearing forces exerted by the high pressure surfaces are substantially uniform across the high pressure surfaces.

17. A method of making a composite structure such as a printed circuit board, comprising at least one foil circuit element of a predetermined pattern, said method comprising:

a. laying on a dielectric substrate a foil sheet with a thermal adhesive layer therebetween, b. then pressing against a section of said foil sheet a face of a heated die comprising a die element having two lateral die shoulder portions corresponding in shape and location to said circuit element pattern and having two high pressure surfaces, each having a substantial angular component generally parallel to said die face, so as to press outer portions of said foil section into the substrate, c. shearing said foil section at shearing corners at an outside edge of each die face shoulder portion, d. engaging said foil section with a blunted inwardly and convexly rounded inner transitional surface portion of each die face shoulder portion, e. providing pressure relief at a middle portion of said foil section between said die shoulder portions, f. bonding said foil section to said substrate by such application of heat and pressure against the foil section, while shearing said foil section from the foil sheet, and g. providing cavities on opposite sides of said foil section to receive excess foil without any substantial bonding thereof to the substrate 18. The method as recited in claim 17, wherein said dielectric substrate is a thin sheet of dielectric and a yielding substrate is placed below said dielectric sheet prior to the pressing of said die face against the foil sheet.

19. A circuit board made according to the method of claim 17, said circuit board comprising at least one conductive foil section bonded to a dielectric substrate, said foil section having:

a. two outer portions of moderate width bonded to and pressed into said substrate, and lying generally in a plane approximately parallel to and below the surface of the substrate, and b. a foil section middle portion positioned above said foil outer edge portions and bonded to the substrate.

20. The circuit board as recited in claim 19, wherein there is a second foil section which is similar to the foil section recited in claim 19 and which is bonded to said substrate, which foil sections are heavy gauge metal and spaced no greater than about one-tenth of an inch from each other, measured center line to center line.

21. The circuit board as recited in claim 19, wherein there is a second foil section which is similar to the foil section recited in claim 19 and which is bonded to said substrate, which foil sections are light gauge metal and spaced no greater than about 0.04 of an inch from each other, measured center line to center line.

* * * * *